United States Patent [19]

Brosh

[11] 4,425,511

[45] Jan. 10, 1984

[54] PLANAR COIL APPARATUS EMPLOYING A STATIONARY AND A MOVABLE BOARD

[76] Inventor: Amnon Brosh, 16 Sunnyside Dr., Montvale, N.J. 07645

[21] Appl. No.: 232,654

[22] Filed: Feb. 9, 1981

[51] Int. Cl.³ .............................................. H03K 3/00
[52] U.S. Cl. ..................................... 307/106; 307/116; 336/73; 336/75; 336/79; 336/115; 336/117; 336/119
[58] Field of Search ..................... 336/129, 73, 75, 77, 336/79, 115, 117, 119; 307/106, 116

[56] References Cited

U.S. PATENT DOCUMENTS 4,117,438  9/1978  Kim et al. ............................ 336/75

FOREIGN PATENT DOCUMENTS 217918  8/1924  United Kingdom ................. 336/75

Primary Examiner—A. T. Grimley
Assistant Examiner—Susan Steward
Attorney, Agent, or Firm—Arthur L. Plevy

[57] ABSTRACT

A planar coil apparatus is disclosed for providing an output signal indicative of a movement between at least a first and a second position. A first stationary planar member has disposed on a surface, a first flat coil configuration which is emplaced thereon by a printed circuit or similar technique. Located adjacent to this coil on the board is a second coil of similar configuration. A drive signal such as that obtained from an AC or pulse source is applied to the input terminals of one of the coils which constitutes the drive coil. A second planar board is positioned relatively congruent and above the first board and has located thereon a closed coil configuration which constitutes a closed coil loop. As this movable board is brought into proximity with the stationary board, magnetic flux is coupled via the loop from the drive coil to the second coil which serves as the sense coil. By monitoring the output of the sense coil, an AC signal can be detected when the movable board is within a predetermined range of distances from the stationary board. The detection of the AC signal indicates a change of position or state. Various other arrangements employ a movable board configuration containing a plurality of coils in conjunction with a stationary board configuration containing predetermined drive and sense coils to represent various coding patterns.

10 Claims, 11 Drawing Figures

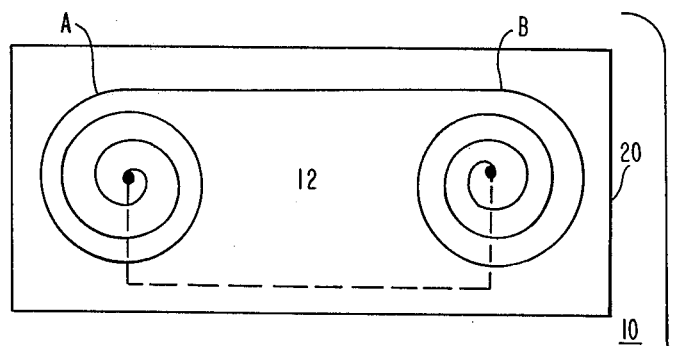
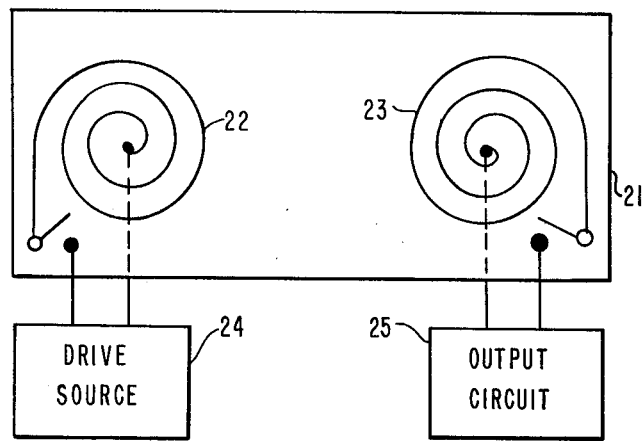
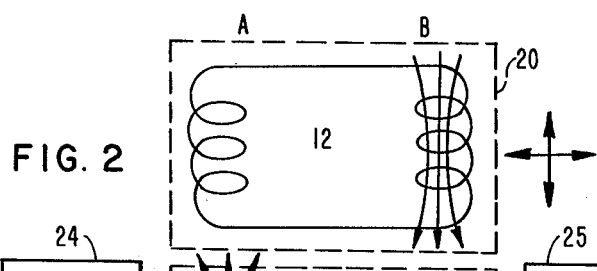
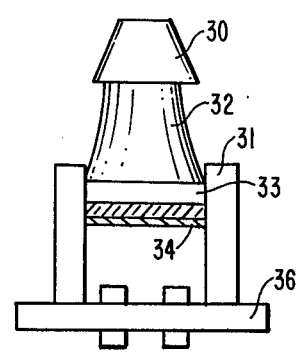
FIG. 1
FIG. 2
FIG. 3
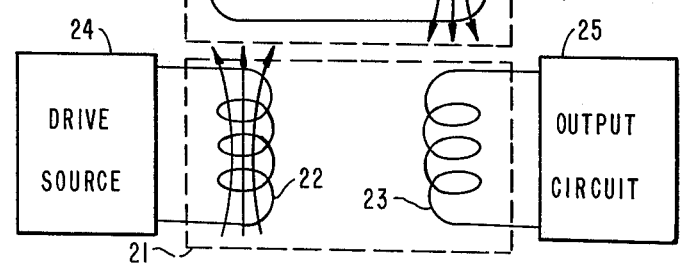
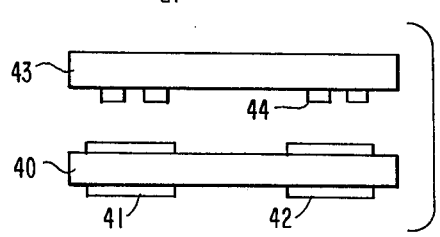
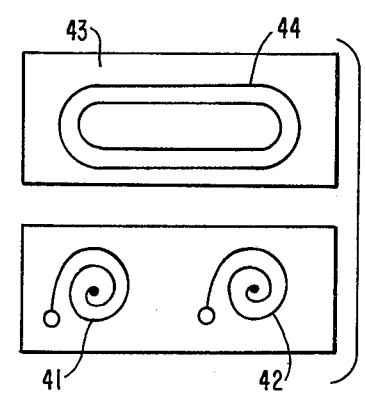
FIG. 4A
FIG. 4B

PLANAR COIL APPARATUS EMPLOYING A STATIONARY AND A MOVABLE BOARD

BACKGROUND OF THE INVENTION

This invention relates to planar coil configurations and more particularly to such configurations employed as motion sensors, switches and other devices.

The concept of utilizing planar coil configurations to provide transducer operation as to convert, for example, motion to an electrical output signal has been described in my copending application entitled *PLANAR COIL APPARATUS FOR PROVIDING MOTION SENSORS, SWITCHES AND VARIOUS STRUCTURES* filed on Dec. 9, 1980 as Ser. No. 214,606.

In this application, two planar coil members are positioned one above the other in a parallel plane leaving a space between and a ferromagnetic coupling member is movably positioned in the space to thereby allow a magnetic field induced in one coil to couple to the other coil when said ferromagnetic member is moved out of said space and to prevent coupling of the field when the member is disposed within the space. This transducer has extreme advantages over the prior art devices such as conventional motion sensing structures.

Such prior art devices may employ variable resistance elements as in displacement transducers. These devices have a sliding contact or wiper arm which moves across a resistance element. The wiper is mechanically linked to a sense shaft and hence, the transducers operate on a contacting principle. It is this feature that causes them to wear out or fail under a large number of cycles.

Many other types of transducers also exist such as inductive or capacitive transducers which convert a displacement into a change of inductance or capacitance. These prior art devices are either more costly to manufacture or less reliable than the non-contacting devices using planar coils.

A switch is basically a simple form of a sensor and operates to provide a change in state in response to physical motion. In this manner, a switch is a very simple type of motion sensor. As described in the copending application and as further evident from the prior art, it is extremely desirable to provide a non-contacting motion sensor which is economical, exhibits a long lifetime and hence, increases reliability. The sensor to be described is a motion sensor which operates on the coupling or decoupling of signals between planar coils. Planar coils are well known in the art and essentially are printed circuit spiral configurations which may be fabricated by printed circuit techniques, thin film techniques or other processes.

Planar coils have been described in the above noted copending application and are also sometimes referred to as printed circuit coils. U.S. Pat. No. 4,075,591 entitled *PRINTED CIRCUIT COILS* issued on Feb. 21, 1978 to D. Haas depicts a spiral type coil employed to obtain a relatively large inductance without sacrificing Q. Other patents such as U.S. Pat. No. 3,757,068 entitled *KEYBOARD ACTUATING MECHANISM WITH PARTICULAR FEEL AND CONTACT MECHANISMS* issued on Sept. 4, 1973 to B. Musch et al. describe a switch mechanism which can be employed in a keyboard using printed circuit coils. My copending application entitled *DISPLACEMENT TRANSDUCERS EMPLOYING PRINTED COIL STRUCTURES* filed on Apr. 11, 1979 as Ser. No. 028,981 discloses a displacement transducer which includes plurality of planar circuit boards, each having disposed on a surface a spiral coil structure. The boards have central apertures and are positioned in a stacked array separate from one another. A magnetic member inserted into the aligned apertures of the configuration varies the coupling between coils.

The present invention also relates to a planar coil configuration, which configuration can be used as a motion sensor, a switch, as well as other configurations. This structure differs from the structure of the first described copending application in that a first board containing a planar coil configuration is stationary and a second board also containing a planar coil configuration moves with respect to the first board to effect the coupling between the coils on the stationary board. There is no need to use magnetic members. The structure, as in the copending application, is completely noncontacting and hence, possesses an extremely long life and is capable of operating without failure for a large number of operating cycles.

BRIEF DESCRIPTION OF THE PREFERRED EMBODIMENT

Apparatus for providing an output signal indicative of a movement between at least a first and a second position, comprising a first stationary planar member having disposed on a surface thereof a first flat serpentine coil or helical structure and at least a second flat helical coil structure adjacent thereto, means for applying a drive signal to said first coil, a second movable member having disposed on a surface thereof a closed loop coil structure, a means for moving said second planar member in a direction parallel to said first member and overlying the same and in close proximity thereto to allow magnetic flux induced in said first coil to couple to said second coil, whereby as said second member is moved close to said first member, the magnitude of said induced flux increases.

BRIEF DESCRIPTION OF THE FIGURES

FIG. 1 is a simple perspective plan view of a motion sensor according to this invention;

FIG. 2 is a schematic equivalent diagram of the sensor of FIG. 1;

FIG. 3 is a side elevational view of a key switch;

FIGS. 4A and 4B are, respectively, side and top plan views of an alternate transducer arrangement;

DETAILED DESCRIPTION OF THE INVENTION

Figure 5A:
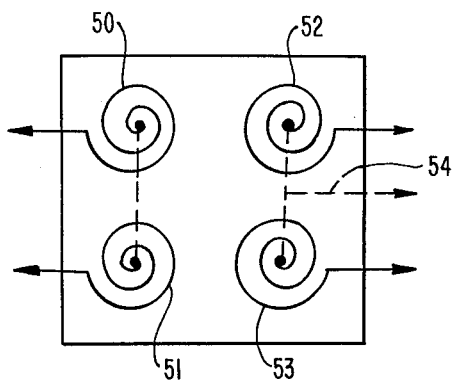
FIGS. 5A and 5B are, respectively, top plan views of a stationary and movable board employing alternate coil configurations.

Referring to FIG. 1, there is shown a motion sensor 10 operating according to the principles of this invention. A top planar member 20 has a double spiral coil configuration 12 deposited on the top surface comprising a first coil A and a second coil B. Essentially, the planar member 20 is a printed circuit board and employs conventional printed circuit materials, such as glass, cloth, teflon or a paper base phenolic composition. It is, of course, understood that any of the many materials can be employed for circuit board 20 as presently used to fabricate conventional printed circuit boards, thick and thin film circuits etc.

The coil configuration 12 comprising coils A and B is etched, stamped, printed or plated on the planar base member 20 and a suitable conductor material such as copper is employed according to printed circuit techniques. The coil configuration depicted consists of a first coil A and a second coil B with each terminal connected together to form a parallel or closed loop coil structure. While two coils are shown, it is understood that two additional coils can be emplaced on the underside of the board or connections between the coil terminals can be made on the underside of the board via plated through holes.

The board 20, as will be explained, is movable with respect to a stationary board 21. The board 21 is also fabricated from a suitable printed circuit substrate material and has deposited thereon a first drive coil 22 and a second sense coil 23. The drive coil has applied to its terminals a source of drive potential 24 which may be an AC or pulse source. The sense coil 23 lies in the same plane as the drive coil 22 as constructed on the surface of the substrate 21 and has its output terminals coupled to a suitable output circuit 25 which may comprise a selective frequency amplifier, demodulator or an AC responsive device.

As the top board 20 is moved into the vicinity of the bottom or stationary board 21, coupling between the drive coil 22 and coil A of the board 20 increases, thus inducing a strong signal in coil A. Since coil B is connected to coil A, as further depicted in the equivalent circuit of FIG. 2, the induced current flows in coil B to create a field which is coupled to the sense coil 23 located on the stationary board 21. Hence, the sense coil 23 provides a signal which increases in amplitude as the movable board 20 is moved closer to the stationary board 21. As indicated, an equivalent circuit depicting the type of coupling is depicted in FIG. 2.

In the above described embodiment, when a signal of about one to one and one volt is applied to a drive coil 22 at a frequency between 100 to 500 KHz, the change of signal in the sense coil 23, due to a motion of approximately 0.08", was greater than two hundred millivolts. In such a structure, each coil is about ¼" in diameter and consists of one or more turns of conventional printed circuit copper conductor.

In regard to the structure depicted in FIGS. 1 and 2, it is seen that the structure is extremely simple to implement. For example, the transducer of FIG. 1 requires a small number of printed circuit coils. The movable board 20 has coils A and B connected together and has no output leads. The operation is such that no ferromagnetic material is required in the form of a core or sheet. Essentially, this results in a substantial reduction in cost, while removing the dependency on permeability which is subject to temperature variations and limitation. The impedances of the planar coils are low, thereby rendering operation completely non-susceptible to stray coupling and EMI associated with high impedance techniques. Also, when pairs of coils are used, as in FIG. 5, the coils are printed in such a way that they reduce EMI susceptibility.

Referring to FIG. 3, there is shown an arrangement employing the above described technique to implement a key switch function. Numeral 30 designates a typical key switch actuator which is movably secured within a housing 31 to enable the key switch member to move in the direction of the arrow. Secured to the moving arm 32 is a planar circuit board 33, which board contains a movable coil configuration as 20 of FIG. 1.

Secured to the underside of the board is an elastomeric member 34 which is fabricated from a rubber or plastic or some other conventional and well known compressible and isolation material. The guide housing 31 is secured to a stationary board 36 which contains a coil configuration consisting of a drive and a sense coil as 22 and 23 of FIG. 1.

As one can ascertain from FIG. 3, if the member 30 is accessed, the board 33 moves into close proximity with the coil configuration on the stationary board 36. In this manner, the drive coil signal propagates to the sense coil output as described above, which constitutes a signal indicative of switch closure. When the boards are separated by the predetermined distance, as shown in FIG. 3, the sense coil has no output, thus constituting an open circuit condition. The coils deposited on board 36, as the drive and sense coils, could be printed symmetrically opposing as in FIG. 5A, to reduce susceptibility to electromagnetic interference.

The particular advantage associated with the structure shown in FIG. 3 is the fact that the key switch requires no ferromagnetic material and hence, eliminates the necessity of a hole or a slot as in prior art arrangements and thus reduces cost. It is further noted that both the moving coil and the stationary board can be encapsulated or vulcanized in rubber to obtain protection of the printed coils.

Referring to FIG. 4A, there is shown an alternate embodiment of a transducer as depicted in FIG. 1. The stationary board 40 contains a drive coil 41 and a sense coil 42 of a similar configuration as the coils 22 and 23 of FIG. 1 and as shown in the top view of FIG. 4B. In any event, the movable board contains one or more loops, or a single turn, of a copper conductor 44 as also depicted in FIG. 4B. The loops 44 on the movable board 43 link the magnetic flux of the drive coil 41 to the sense coil 42 as the movable board 43 is moved closer to board 40. The loop shown operates sufficiently in lieu of the helical coils as depicted in FIG. 1.

Referring to FIG. 5A, there is shown a four coil structure employing two drive coils 50 and 51 mounted adjacent two sense coils 52 and 53. The sense coils have their inner terminals connected together to form a center tap at terminal 54. This results in a balanced structure where the movable board 55 contains two conductive loops 56 and 57, which loops are moved closer to or away from the coils on the stationary board as described above.

Figure 5B:
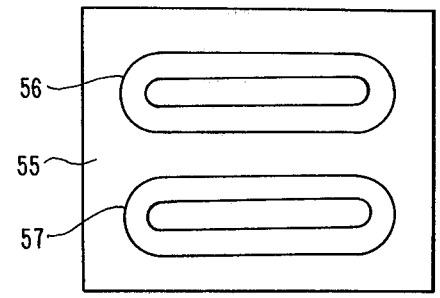

In the configuration shown in FIGS. 5A and 5B, with coils of about ¼" in diameter and with a four volt pulse signal applied to the drive coils 50 and 51, the sense coils 52 and 53 provide an output of between 150 to 200 millivolts when the movable board 55 is between 0.006 to 0.010" away from the stationary board. When the movable board is about 0.050" away, there is no appreciable signal output.

The center tap associated with the sensing coils is connected to the power supply ground. The performance was extremely reliable due to the low output impedance of the device and the symmetry of the balanced coil structure in relation to ground. It features low susceptibility to contamination which is a problem plaguing capacitive non-contacting switch arrays. One main feature of this invention is that switch arrays and complete keyboards can be fabricated economically using complete coil structures and interconnections all performed using printed circuit board manufacturing techniques. The versatility of the above described structure is unique and many different and useful configurations can be accommodated.

Figure 6A:
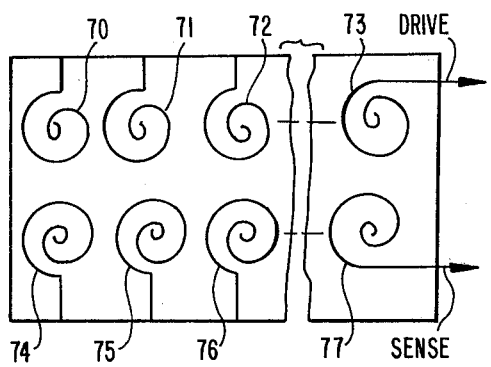
FIGS. 6A and 6B are, respectively, top plan views of a stationary and moveable board configurations utilized in a coding sequence.

Referring to FIG. 6A, there is shown one embodiment for coding purposes of a proposed stationary board arrangement. Drive coils are aligned in the top row and designated as 70-73. The dashed lines are indicative of the fact that a plurality of such drive coils can be accommodated on a single board. The sense coils as 74 to 77 are located beneath the drive coils.

Figure 6B:
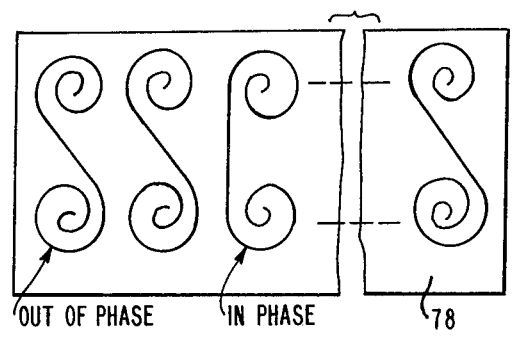

A movable board 78 is shown in FIG. 6B and is arranged in such a way so that coupling or interconnections between pairs of coils as 70 to 73 are in phase or out of phase with the drive signal. In this manner, an in phase condition can represent a binary one and an out of phase condition can represent the binary zero. Once the movable board 78 is placed in the vicinity of the board shown in FIG. 6A, the coupling coil configurations on board 80 cause the pairs of drive and sense coils to align and hence, the coded sequence is transferred from the drive to the sense circuits as from coil 70 to coil 74 and so on. This arrangement can also be used in a key switch application to generate coded messages in response to key closure.

It is understood that the concept depicted in FIGS. 6A and 6B are extremely flexible in construction and the coils can be arranged in a variety of physical configurations to suit various applications.

Figure 7A:
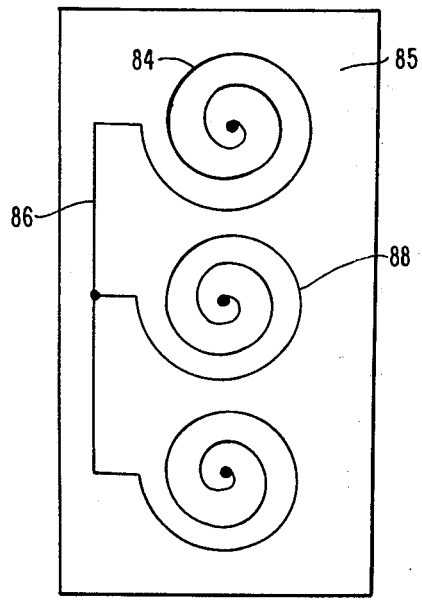
FIGS. 7A and 7B are, respectively, top plan views of a stationary and movable board configuration each employing three coil configurations for the detection of binary values.
Figure 7B:
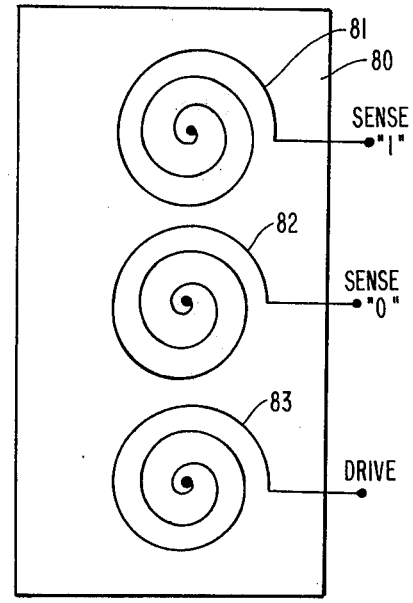

Referring to FIGS. 7A and 7B, there is shown a convenient technique for coding which employs three coils. The stationary board 80 includes a first coil 81 designated to sense a binary one, a center coil 82 designated to sense a binary zero and a drive coil 83 for receiving a source of AC or pulse signals. The stationary board 85 contains three coils each coupled to a common terminal 86. The center coil 88 can be removed or left in circuit by breaking the copper conductor designated by the X. In this manner, the drive signal can be linked to one of the two sense coils, depending on whether the circuit path is interrupted or broken at the X location. Coupling the drive signal to sense coil 81 would designate a binary one, while coupling the drive signal to sense coil 82 would designate a binary zero.

To employ the above technique, one would employ a stationary board such as board 80 with rows or coils or drive and sense coils as 81 to 83. The movable board, such as 85, would contain a plurality of three coil patterns which would accommodate a complex code such as those employed on credit cards and so on. The desired code would be provided by breaking the link (X) to provide any desired binary code. This can be done by the use of a drill or a numerically controlled drill press which would be programmed to cut the necessary links to provide the binary code.

It is thus understood that the printed coil structure, whose basic operation was described in FIG. 1, can be employed to provide complex coding arrangements with great advantages. The advantages reside in the fact that the printed circuit coil structures are extremely simple to fabricate and have relatively low cost. In this manner, printed circuits of relatively small size are used. The system further provides a high output signal which is associated with good reliability and an optimum signal to noise ratio. The coil structures lend themselves to relatively interference free operation as coil polarity can be simply changed by reversing the direction of wind or terminal designation and pairs of coils of opposite polarities may be used. The coding board, such as 85, is completely portable and is not in any manner linked to the stationary system contained on board 80, and hence, the coded board 85 can be employed as a portable key, credit card or to code various operations. The system is relatively stationary in that the portable board, once emplaced in close proximity to the stationary board, is not in motion. Since the output signals are AC signals, they are easily generated and easily detected both as to amplitude and phase. Frequency of operation, as above described, can be quite high as in the range of 100 KHz and upward. In this manner, the signal frequency associated with the sense coils is specified and ascertained and can be easily detected and responded to. The basic structure eliminates the requirement for ferromagnetic pieces, while providing an efficient and simple transducer arrangement which requires no contact between the stationary and moving boards or between the associated coils.

There are a number of other sensor configurations which will become apparent to those skilled in the art in reading the above disclosure. In employing the principle of inductive coupling, one can construct linear and rotary motion transducers as well as other arrangements. It is, of course, understood that all alternative embodiments of the above described technique as employing in switching and motion sensing are relatively unlimited and it is therefore understood that those skilled in the art will discern many alternate configurations which operate according to the principles and scope of this invention as encompassed in the following claims.

I claim:

1. Apparatus for providing an output signal indicative of a movement between at least a first and a second position comprising:
    (a) a first stationary planar member having disposed on a surface thereof a first flat serpentine coil structure, and at least a second flat serpentine coil structure adjacent thereto; with said coils positioned side by side;
    (b) means for applying a drive signal to said first coil;
    (c) a second movable planar member having disposed on a surface thereof a closed loop coil structure;
    (d) means for moving said second planar member in a direction transverse to said first member and overlying the same and in close proximity thereto to allow flux induced in said first coil to couple to said second coil, whereby as said second member is moved closer to said first member, the magnitude of said induced flux increases, and as said second member is moved further away from said first member, there is no flux induced in said second coil.

2. The apparatus according to claim 1 whereby said closed loop coil comprises first and second serpentine coil structures having their terminals connected together to form a closed loop coil.

3. The apparatus according to claim 1 wherein said first and second coil structures are spiral configurations comprising a helical format of a conductive material emplaced on said planar member by a printed circuit technique.

4. The apparatus according to claim 1 wherein said first and second planar members are relatively congruent.

5. The apparatus according to claim 1 wherein said movable planar member is coated with an elastomeric layer.

6. The apparatus according to claim 1 wherein said closed loop coil structure comprises a single turn of wire manifesting a closed loop.

7. The apparatus according to claim 1 further including output means coupled to said second coil for responding to said induced flux.

8. The apparatus according to claim 1 wherein said means for applying a drive signal to said first coil is an AC generator.

9. The apparatus according to claim 1 wherein said means for applying a drive signal to said first coil is a pulse generator.

10. The apparatus according to claim 8 wherein said AC signal is between 100 KHz to 500 KHz.

* * * * *